United States Patent
Barclay et al.

(10) Patent No.: US 6,841,331 B2
(45) Date of Patent: Jan. 11, 2005

(54) POLYMERS, PROCESSES FOR POLYMER SYNTHESIS AND PHOTORESIST COMPOSITIONS

(75) Inventors: George G. Barclay, Jefferson, MA (US); Stefan J. Caporale, Austin, TX (US); Robert J. Kavanagh, Cambridge, MA (US); Nick Pugliano, Grafton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/083,675

(22) Filed: Feb. 26, 2002

(65) Prior Publication Data

US 2003/0027075 A1 Feb. 6, 2003

Related U.S. Application Data

(60) Provisional application No. 60/271,401, filed on Feb. 27, 2001.

(51) Int. Cl.[7] .............................................. G03F 7/004
(52) U.S. Cl. ..................... 430/270.1; 430/326; 430/905
(58) Field of Search ............................. 430/270.1, 326, 430/905

(56) References Cited

U.S. PATENT DOCUMENTS

| 4,384,037 A | 5/1983 | Hosaka et al. |
| 6,028,123 A | 2/2000 | Hirayama et al. |
| 6,602,646 B1 * | 8/2003 | Sato et al. ............... 430/270.1 |

FOREIGN PATENT DOCUMENTS

EP  1 074 566 A1  2/2001

OTHER PUBLICATIONS

W. Billmeyer, Jr., ed., Textbook of Polymer Science, 2nd, Ed., Chapters 11 and 12, pp. 328–376 (Wiley–Interscience, a Division of John Wiley and Sons, Inc.), 1971.

* cited by examiner

*Primary Examiner*—Rosemary Ashton
(74) *Attorney, Agent, or Firm*—Peter F. Corless; Darryl P. Frickey; Edwards & Angell, LLP

(57) ABSTRACT

The invention includes new polymers and methods for providing such polymers and photoresists that comprises the polymers. Methods of the invention include those that comprise providing a reaction mixture and adding over the course of a polymerization reaction one or more polymerization reagents to the reaction mixture to provide the polymer. Photoresists containing a polymer of the invention can exhibit significantly improved lithographic properties.

50 Claims, No Drawings

POLYMERS, PROCESSES FOR POLYMER SYNTHESIS AND PHOTORESIST COMPOSITIONS

The present application claims the benefit of U.S. provisional application 60/271,401, filed Feb. 27, 2001, which is incorporated by reference herein in its entirety.

BACKGROUND OF THE INVENTION

1. Field of the Invention

The present invention relates to new polymers that can exhibit significantly improved lithographic results to a photoresist comprising the polymer, processes for producing such polymers and photoresists that contain the polymers. Synthetic methods of the invention include regular or substantially continuous addition of one or more polymer precursors to a reaction mixture occurs over the course of the polymer synthesis. Preferred polymers of the invention are suitable for use in photoresists imaged at short wavelengths such as sub-250 nm or sub-200 nm, particularly 248 nm, 193 nm and 157 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

Interest also has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). See European Published Application EP915382A2. Quite recently, imaging at 157 nm has been proposed. See Kunz et al., SPIE Proceedings, (Advances in Resist Technology), vol. 3678, pages 13–23 (1999). Use of such short exposure wavelengths can enable formation of smaller features. Accordingly, a photoresist that yields well-resolved images upon 248 nm, 193 nm or 157 nm exposure could enable formation of extremely small (e.g. sub-0.25 µm) features that respond to constant industry demands for smaller dimension circuit patterns, e.g. to provide greater circuit density and enhanced device performance.

However, many current photoresists are generally designed for imaging at relatively higher wavelengths, such as G-line (436 nm) and I-line (365 nm) are generally unsuitable for imaging at short wavelengths such as sub-200 nm. Even shorter wavelength resists, such as those effective at 248 nm exposures, also are generally unsuitable for sub-200 nm exposures, such as 193 nm and 157 nm imaging.

It thus would be desirable to have new photoresist compositions, particularly resist compositions that can be imaged at short wavelengths such as sub-200 nm exposure wavelengths, particularly 193 nm and 157 nm. It also would be desirable to have new resin components for use in such photoresists.

SUMMARY OF THE INVENTION

We have now found novel polymers and photoresist compositions that comprise the polymers as a resin component. The photoresist compositions of the invention can provide highly resolved relief images upon exposure to short wavelengths, including sub-300 nm and sub-200 nm wavelengths.

We also have found new methods for synthesis of polymers that are highly useful as a photoresist resin component. Synthetic methods of the invention include addition of one or more polymer precursors (e.g. unsaturated monomer or oligomer) and/or other reagents (e.g. initiator) over the course of the polymer synthesis.

We have surprisingly found that such an extended addition or continuous feed of one or more polymerization reagents can provide improved polymer homogeneity, e.g. the polymer will have more uniform distribution of repeat units throughout individual polymer chains and across the molecular weight distribution of the polymer relative to a comparable polymer made by other methods, e.g. a batch synthesis process.

We have further found that use of a polymer obtained by a process of the invention in a photoresist composition can impart significantly improved lithographic properties to the resist, including reduced line edge roughness and otherwise enhanced relief image profiles.

As referred to herein, the term polymerization reagent refers to compounds that are active in the polymerization reaction, whether or not those compounds are incorporated into the polymer chain. Thus, polymerization reagents are inclusive of reactive monomers, oligomers or other polymer precursors that are incorporated into the formed polymer as a result of the polymerization reaction, as well as compounds such as a free radical initiator or chain transfer agent that is active in the polymerization reaction, but is not typically incorporated into the formed polymer.

References herein to "incorporated polymerization reagent" refer to polymerization reagents that are incorporated into the formed polymer as a result of the polymerization reaction. More particularly, references herein to "incorporated polymerization reagent" exclude non-incorporated compounds such as a free radical initiator and includes only those reagents that through covalent linkage become part of the formed polymer. For example, unsaturated or otherwise reactive monomers or oligomers that react to form the polymer are incorporated polymerization reagents.

At least one incorporated reagent will be added to a reaction mixture or vessel over the substantial course of the reaction. Suitably, one, two, three, four or five polymerization reagents are added to a reaction mixture over the course of the reaction, more typically one, two or three polymerization reagents are added over the course of the reaction. By stating that a polymerization reagent is added over a substantial portion of the reaction synthesis, the reagent may be added to a reaction mixture over at least about 30, 40, 50, 60, 70, 80, 90 or 95 percent of the reaction time. The duration of reaction time is defined as commencing with the start of addition of one or more incorporated polymerization reagents to a reaction vessel or mixture and ending with substantial cooling (e.g. >20° C. or 30° C.) or quenching of the reaction mixture or other reaction termination.

Preferably, an incorporated polymerization reagent being added over the substantial course of the reaction will have a faster reaction rate relative to one or more polymerization reagents of the reaction. Thus, for example, if two, three, four, or five distinct reactive monomers, oligomers or other polymerization reagents that are incorporated into the formed polymer (referred to herein as an "incorporated polymerization reagent") are reacted, preferably at least the fastest one or two reagents are added to a reaction mixture over the substantial course of the reaction.

As referred to herein, the relative reaction rates of multiple incorporated polymerization reagents are determined by measuring the change in concentration of a particular polymerization reagent with time, particularly by continuous or periodic spectral readings, as are known and described e.g. in March, *Advanced Organic Chemistry*, page 223 (Fourth Edition, John Wiley). A preferred protocol for determining reaction rates of multiple incorporated polymerization reagents is the following: the multiple incorporated polymerization reagents that are to form the copolymer are placed in a reaction vessel in solvent preferably at a 1 molar concentration and reaction temperature 100° C. or the minimum temperature required to induce reaction, whichever temperature is lower. Reaction mixture samples are removed at 10 minute or other defined interval and assessed by $^1$H NMR for consumption of each of the polymerization reagents over time. For example, for unsaturated monomer or oligomer polymerization reagents, disappearance of olefenic protons of each unsaturated reagent can be assessed. Relative reaction rates then can be determined for each reagent.

Typically, the incorporated polymerization reagents of a given reaction will differ in relative reaction rates by at least about 20 percent, more typically a greater difference such as at least about a 30, 40, 50, 60, 70, 80, 90, 100, 150 or 200 percent difference in reaction rates. Thus, the incorporated polymerization reagents can be readily "ranked" as having the "fastest", "second fastest", "slowest", etc. reaction rate for the particular polymerization reaction.

Generally preferred synthetic methods of the invention may include: i) charging a reaction vessel with just essentially solvent or also with one or more polymerization reagents such as one or more distinct monomers or other polymer precursors and initiator (e.g. free radical initiator, acid for acid-promoted polymerization, and the like, to provide a reaction mixture); ii) addition of one or more reagents, e.g., a monomer, another polymer precursor and/or additional initiator, to the reaction mixture over a substantial portion of the course of the reaction.

Polymers of the invention may be homopolymers or, generally more preferably, are higher order polymers that contain 2, 3, 4 or 5 or more distinct repeat units, i.e. preferred are copolymers, terpolymers, tetrapolymers and pentapolymers. Unless otherwise indicated herein, the term copolymer is inclusive of higher order polymers such as terpolymers, tetrapolymers and pentapolymers.

Polymers may suitably comprise repeat units produced by polymerization of reagents selected from the group of:

1) an electron deficient reagent or a reagent with one or more electron-withdrawing groups such as an anhydride including maleic anhydride or a halogenated olefin, particularly a fluorinated olefin such as tetrafluoreothylene (TFE) and the like;

2) a comparatively electron rich reagent (such as olefinic monomers not including an electron withdrawing group within one, two or three carbons of a vinyl group), e.g. an unsaturated alicyclic (e.g. endo- or exocyclic carbon-carbon double bond); or acyclic alkyl group suitably having from 3 to about 20 carbons, more typically 4 to about 20 carbons such as norbornene, cyclohexene, vinyl adamantyl and the like; or an unsaturated vinyl heteroalicyclic or heteroacyclic (particularly oxygen or sulfur heteroalicyclic and heteroalicyclic) such as to provide a polymerized cyclic ether (e.g. a tetrahydrofuran group fused to a polymer backbone) or cyclic thioether, alkoxy e.g. having 1 to about 12 carbon atoms, and the like;

optionally and often preferably 3) an acrylate (which includes substituted acrylates such as methacrylates), particularly acrylates that have a photoacid-labile group such as t-butyl acrylate, t-butyl methacrylate, adamantyl acrylate, adamnantyl methacrylate, and the like.

In the synthetic methods of the invention, a reaction vessel may be suitably charged with reagent 2) (i.e. electron rich reagent), and an electron deficient reagent 1) is added to reaction vessel over the course of the reaction. A free radical initiator also may be added over the course of the reaction, or may be added as directly to the initial reaction mixture at the start of the reaction.

Methods of the invention may be conducted by a variety of other arrangements. For instance, separate addition apparatus (e.g. feed lines) may be used to add multiple reagents to a reaction mixture over the course of a reaction. For example, initiator may be added via one feed line and an unsaturated monomer such as an acrylate may be added via a second feed line.

Suitably, the polymerization reagent(s) contained in the reaction vessel are present in a suitable solvent such as e.g. dioxane, DMF, chloroform, and the like. The one or more added reagents also may be admixed in such reaction solvents.

As discussed, preferably, one or more polymerization reagents are added to a reaction mixture over a substantial portion of the reaction synthesis. Suitably, the one or more added polymerization reagents are feed to a reaction mixture over at least about 50, 60, 70, 80, 90 or 95 percent of the total reaction time, i.e. over the substantial course of the reaction. As should be understood, reaction time may end when the reaction mixture is quenched (e.g. with water, ethanol or other alcohol, etc.,) or the formed polymer is otherwise isolated, or temperature of the reaction mixture is substantially reduced, e.g. to room temperature or 0° C.

The rate of addition of one or more polymerization reagents to a reaction mixture can be substantially constant over the course of a reaction or the addition rate can vary over the course of the reaction to produce even more homogenous polymer. For instance, initiator can be added at a rate to maintain a substantially constant initiator concentration in the reaction mixture over a substantial course of the polymer synthesis. Such a constant concentration of initiator can further provide polymer homogeneity.

An unsaturated monomer or oligomer may be added at varying rates to correspond to the current state of the polymerization reaction. For instance, an unsaturated monomer such as an acrylate may be added at a substantially linearly decreasing rate over the course of the polymerization reaction. Preferably an unsaturated monomer such as an acrylate may be added at a decreasing rate such that over the course of the polymerization reaction the ratio of monomer concentrations is substantially constant, e.g. the ratio of the continuous feed polymerization reagent to the concentration of the other polymerization reagents in the reaction mixture is substantially constant.

Additionally, a polymerizaton reagent that is added over the substantial course of a reaction preferably will be added substantially continuously over the addition time, e.g. suitably addition of the reagent polymerization will not be terminated for more than about 1, 2, 3, 4, 5, 10, 15, 20, 25, 30 or 45 minutes during the entire addition time. More preferably, addition of the polymerization reagent addition of the reagent will not be terminated for more than about 5, 10, 15, or 20 minutes during the entire addition time.

Polymer syntheses of the invention may be suitably run at elevated temperatures, e.g. above about 50° C., or above about 60, 70, 80 or 90° C., but less than about 140° C. or 120° C. The reaction suitably can be run at reflux.

Polymers of the invention may be preferably employed in photoresists imaged at sub-200 nm wavelengths such as 193 nm, and thus preferably will be substantially free of any phenyl or other aromatic groups. For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers for 193 nm imaging are completely free of aromatic groups. Aromatic groups can be highly absorbing of sub-200 nm radiation and thus are undesirable for polymers used in photoresists imaged with such short wavelength radiation, particularly 193 nm.

Polymers of the invention also may be suitably utilized in resists imaged at higher wavelengths, such as 248 nm. Such polymers suitably will contain aromatic groups such as provided by polymerization of a vinyl aromatic group, e.g. a vinylphenol, acetoxystyrene (where the acetoxy group can be de-blocked after polymerization to provide phenolic units), styrene, α-methylstyrene, vinyl naphthalene and the like.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate, optoelectronic substrate or liquid crystal display or other flat panel display substrate having coated thereon a polymer, photoresist or resist relief image of the invention.

The invention also includes polymers obtainable or obtained by a method of the invention.

Other aspects of the invention are disclosed infra.

DETAILED DESCRIPTION OF THE INVENTION

As discussed above, synthetic methods of the invention include addition of one or more polymer precursors (e.g. polymerization reagents such as unsaturated monomer or oligomer) and/or other polymerization reagents (e.g. initiator) over the substantial course of the polymer synthesis.

In preferred aspects, the invention includes methods for preparing photoresist compositions which in general comprise a) providing a polymer by a polymerization reaction that comprises adding over the substantial course of the polymerization reaction one or more incorporated polymerization reagents to a reaction mixture; and then b) admixing the polymer with a photoactive component. The polymer may be suitably isolated and washed, dried, etc. after the polymerization reaction and prior to admixture with the photoactive component and as may be suitable other resist components such as solvent, basic additive, etc. and, in the case of a negative resist, a crosslinker.

As referred to herein, the term "reaction mixture" to which the one or more incorporated polymerization reagents are added over the substantial course of the reaction is inclusive of a reaction vessel which may be pre-charged (i.e. before the start of the addition of the one or more incorporated polymerization reagents) with solvent and/or one or more other polymerization reagents, as well as a reaction vessel that may be completely empty at start of the addition of the one or more incorporated polymerization reagents, i.e. "reaction mixture" is inclusive of a reaction vessel that just includes solvent or that is initially completely or essentially empty and to which reagents are added over the course of the reaction.

The extended additions can be configured in a variety of alternative arrangements. For instance, as indicated, a reaction vessel may be charged with one or more polymerization reagents at the start of a reaction, and one or more polymerization reagents added to the charged reaction vessel over a substantial course of the reaction. Alternatively, a reaction may not be charged with any reagents, but rather each of the polymerization reagents may be added over a substantial course of the reaction. In such instance, the reaction vessel typically will be initially charged with solvent.

A variety of polymerization reagents may be employed in a synthetic process of the invention. For example, preferred polymerization reagents include an anhydride such as maleic anhydride; a lactone; a fluorinated olefin such as tetrafluoroethylene; a carbon alicyclic group such as an optionally substituted norbornene or other cyclic olefin; a heteroalicyclic such as an optionally substituted dihydropyran; or an acrylate such as 2-methyladamantanyl methacrylate or 2-methyladamantanyl acrylate. As used herein, the term acrylate is inclusive of substituted acrylates such as methacrylates.

Methods of the invention are particularly useful for producing polymers that contain repeat units of electron-deficient reagents, e.g. an anhydride particularly maleic anhydride; a fluorinated-olefin such as tetrafluoroethylene and the like, together with repeat units of comparatively electron rich reagents such as optionally substituted norbornene, optionally substituted styrene and the like.

Thus, preferred polymers of the invention may contain i) repeat units with electron-withdrawing groups such as provided by polymerization of an anhydride or a fluorinated olefin and ii) repeat units of alicyclic groups (including carbon alicyclics i.e. the group has all carbon ring members and/or heteroalicyclic i.e. having one or more N, O or S atoms as ring members, preferably 1 or 2 oxygen or sulfur atoms as ring members) preferably where the alicyclic group is fused to the polymer backbone, e.g. the alicyclic ring has at least two carbon ring members that comprise the polymer backbone. Preferred fused carbon alicyclic groups are provided by polymerization of cyclic olefin (endocyclic double bond) compounds such as optionally substituted norbornene groups.

Additionally, an oxygen heteroalicyclic group preferably will be present in a polymer together with polymerized carbon alicyclic compounds such as optionally substituted norbornene.

As referred to herein, the term "carbon alicyclic group" means each ring member of the non-aromatic group is carbon. The carbon alicyclic group can have one or more endocyclic carbon-carbon double bonds, provided the ring is not aromatic.

As referred to herein, the term "heteroalicyclic group" means at least one ring member of the non-aromatic cyclic group is other than carbon, e.g. N, O or S, typically one or two oxygen or sulfur atoms. The heteroalicyclic group can have one or more endocyclic carbon-carbon double bonds, provided the ring is not aromatic. An oxygen heteroalicyclic group means that the group has at least one, and typically only one, oxygen ring atoms.

Preferred alicyclic polymer units carbon alicyclic or heteroalicyclic) may be substituted, e.g. by heteroalkyl groups such as ethers (alkoxy) preferably having 1 to about 10 carbon atoms, alkylthio preferably having 1 to about 10 carbon atoms, alkylsulfinyl preferably 1 to about 10 carbon atoms, alkylsulfonyl preferably having 1 to about 10 carbon atoms; optionally substituted alkyl groups including $C_{1-20}$ alkyl; esters including esters having from 2 to about 20 carbons; and the like.

In the extended additions of methods of the invention, a single polymerization reagent may be added over the substantial course of the reaction, or two or more polymerization reagents may be added over the substantial course of the reaction.

To facilitate formation of polymers having enhanced homogeneity, incorporated polymerization reagent(s) that have the fastest reaction rates relative to all of the incorporated polymerization reagents are added over the substantial course of the polymerization reaction.

In turn, a reaction vessel may be initially charged at the start of the reaction with one or more incorporated polymerization reagents that have comparatively slower reaction rates and the faster-reacting incorporated reagent added to those charged compounds over the substantial course of the reaction.

Thus, in one preferred system of reacting 1) an acrylate compound such as may provide a photoacid-labile group to the formed polymer (e.g. t-butyl acrylate; t-butyl methacrylate; adamantylacrylate, etc.); 2) an anhydride such as maleic anhydride; and 3) unsaturated carbon alicyclic compound such as optionally substituted norbornene or an unsaturated heteroalicyclic compound such as an optionally substituted dihydropyran, the acrylate and anhydride have comparatively faster reaction rates and either or both of those compounds are suitably added over the substantial course of a polymerization reaction to an unsaturated carbon alicyclic compound and/or an unsaturated heteroalicyclic compound, which alicyclic compounds may be charged in a reaction vessel at the start of the reaction.

Other faster reacting incorporated polymerization reagents that are suitably added over the substantial course of the polymerization reaction include fluorinated olefins such as tetrafluoroethylene, and lactones. In many preferred systems of the invention, the reagent with the fastest reaction rate will be an acrylate, and such acrylate reagent preferably should be added over the substantial course of the polymerization reaction.

For use in photoresist compositions, polymers of the invention also will contain one or more units that comprise photoacid-labile moieties. The photoacid-labile group may be a substituent of one or more of the above-mentioned units, such as a substituent of a polymerized vinyl alicyclic ether, vinyl alicyclic thioether or carbon alicyclic group. The photoacid labile moiety also may be present as an additional polymer unit, e.g. as a polymerized alkyl acrylate or alkylmethacrylate, particularly an acrylate having an alicyclic moiety such as methyladamantyl acrylate or methyladamantyl methacrylate. Preferred alicyclic photoacid-labile moieties are tertiary ester alicyclic hydrocarbon groups that have two or more fused or bridged rings. Preferred tertiary ester groups include optionally substituted adamantyl, particularly methyl adamantyl as mentioned above; optionally substituted fencyl groups, particularly ethyl fencyl; optionally substituted pinnanyl; and optionally substituted tricyclo decanyl, particularly an alkyl-substituted tricyclo decanyl such as 8-ethyl-8-tricyclodecanyl e.g. as provided by polymerization of 8-ethyl-8-tricyclodecanyl acrylate and 8-ethyl-8-tricyclodecanyl methacrylate. Additional alicyclic ester groups also will be suitable, including additional bicyclic, tricyclic and other polycyclic moieties.

As mentioned, polymers of the invention preferably contain a heteroalicyclic or carbon alicyclic ring that that is preferably fused to a polymer backbone. A fused heteroalicyclic ring unit preferably contains one or more oxygen and/or sulfur atoms. As indicated above, by stating herein that a cyclic group is fused to a polymer backbone, it is meant that two ring members of the cyclic group, typically two adjacent carbon atoms of the cyclic group, are also part of the polymer backbone. Such a fused ring can be provided by polymerizing a cyclic monomer that has an endocyclic double bond.

Preferred oxygen ring polymer units will be free of other hetero atoms such as sulfur (i.e. only oxygen and carbon ring members). Typically, the oxygen ring unit will contain one or two oxygen ring atoms and may have one or more ring substituents.

Preferred polymers of the invention may contain at least about 2 to 5 mole percent of fused heteroalicyclic units based on total units of the polymer; more preferably from about 5 to 50 mole percent of fused heteroalicyclic units based on total units of the polymer; still more preferably from about 5 or 10 to about 40 or 50 percent of fused heteroalicyclic units based on total units of the polymer.

Preferred polymers of the invention may contain at least about 2 to 5 mole percent of carbon alicyclic units based on total units of the polymer; more preferably from about 5 to 50 mole percent of fused carbon alicyclic units based on total units of the polymer; still more preferably from about 5 or 10 to about 25 or 30 percent of fused carbon alicyclic units based on total units of the polymer.

In polymers of the invention that consist of heteroalicyclic units, carbon alicyclic units and maleic anhydride units (i.e. heteroalicyclic:carbon alicyclic:maleic anhydride terpolymers), preferably the heteroalicyclic units will be present in an amount of from about 5 to about 10, 20, 30, 40, 50, 60, 70 or 80 mole percent based on total polymer units, the carbon alicyclic units (such as optionally substituted norbornene) will be present in an amount of from about 5 to about 10, 20, 30, 40, 50, 60, 70 or 80 mole percent based on total polymer units, and the maleic anhydride units will be present from about 5 to about 20, 30, 40 or 50 mole percent based on total polymer units; and more preferably the heteroalicyclic units will be present in an amount of from about 5 to about 10, 20, 30, 40, 50 or 60 mole percent based on total polymer units, the carbon alicyclic units will be present in an amount of from about 5 to about 10, 20, 30, 40, 50 or 60 mole percent based on total polymer units, and the maleic anhydride units will be present from about 5 to about 10, 15, 20, 25, 30, 40, or 50 mole percent based on total polymer units. In such terpolymers, suitably either or both the heteroalicyclic or carbon alicyclic units will contain a photoacid labile substituents such as a photoacid-labile ester substituent.

As discussed above, polymers of the invention preferably comprise contain one or more repeat units that comprise a photoacid-labile group. The photoacid-labile group may be e.g. a substituent of a heteroalicyclic or carbon alicyclic ring member. Alternatively, and generally preferred, the photoacid-labile moiety will be a polymer repeat unit distinct from repeat units containing a heteroalicyclic group. Preferably, that distinct unit may be a an acrylate or methacrylate that comprises a photoacid-labile ester group. The photoacid-labile group also may be e.g. an acetal group such as many be provided by reaction of a vinyl ether with a hydroxy substituent of a polymer repeat unit.

Preferred photoacid-labile groups are ester groups, particularly esters that contain a tertiary alicyclic hydrocarbon ester moiety. Preferred tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(=O)O—TR' where T is a tertiary ring carbon of alicyclic group R'. In at least many cases, preferably a tertiary ring carbon of the alicyclic moiety will be covalently linked to the ester oxygen, such as exemplified by the below-depicted specifically preferred polymers. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O) O—TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 $Å^3$, more preferably a molecular volume of at least about 135, 140, 150, 155, 160, 165, 170, 175, 180, 185, 190, 195, or 200 $Å^3$. Alicyclic groups larger than about 220 or 250 $Å^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277–287.

Particularly preferred tertiary alicyclic groups of photoacid-labile units include the following, where the wavy line depicts a bond to the carboxyl oxygen of the ester group, and R is suitably optionally substituted alkyl, particularly $C_{1-8}$ alkyl such as methyl, ethyl, etc.

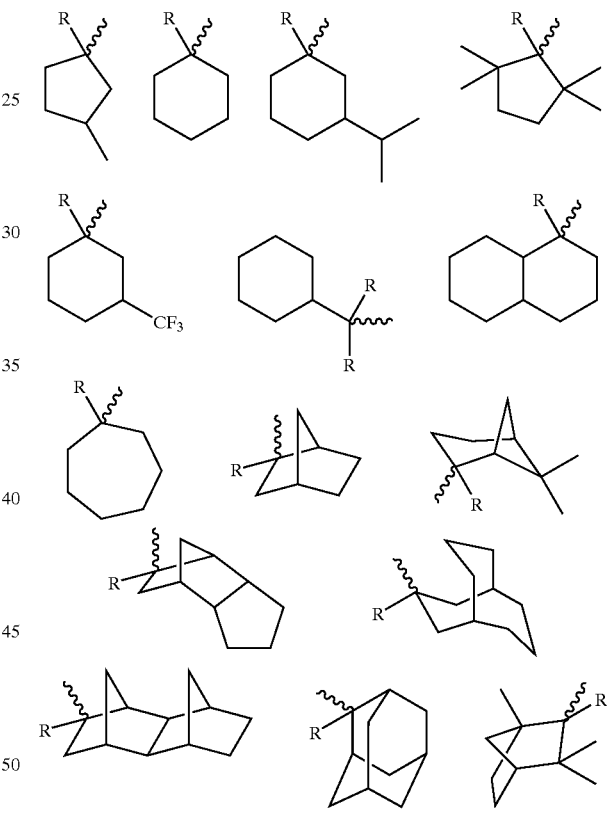

Polymers of the invention also may contain photoacid-labile groups that do not contain an alicyclic moiety. For example, polymers of the invention may contain photoacid-labile ester units, such as a photoacid-labile alkyl ester. Generally, the carboxyl oxygen (i.e. the carboxyl oxygen as underlined as follows: —C(=O)<u>O</u>) of the photoacid-labile ester will be covalently linked to the quaternary carbon. Branched photoacid-labile esters are generally preferred such as t-butyl and —C(CH₃)₂CH(CH₃)₂.

Polymers of the invention also may contain additional units such as cyano units, lactone units or anhydride units. For example, acrylonitrile or methacrylonitrile may be polymerized to provide pendant cyano groups, or maleic anhydride may be polymerized to provide a fused anhydride unit.

Preferred polymers that may be synthesized by process of the invention include those that comprise a structure of the following formula:

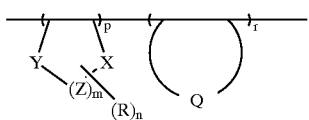

wherein X, Y and Z are each independently carbon, oxygen or sulfur, with at least one of X, Y or Z being oxygen or sulfur, and preferably no more than two of X, Y and Z being oxygen or sulfur;

Q represents an optionally substituted carbon alicyclic ring fused to the polymer backbone (i.e. two Q ring members being adjacent carbons of the polymer backbone); the alicyclic ring suitably having from about 5 to about 18 carbon atoms and is suitably a single ring (e.g. cyclopentyl, cyclohexyl or cycloheptyl), or more preferably Q is polycyclic e.g. and contain 2, 3, 4 or more bridged, fused or otherwise linked rings, and preferred substituents of a substituted Q group include photoacid-labile moieties such as a photoacid-labile ester;

each R is the same or different non-hydrogen substituent such as cyano; optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); a photoacid-labile group such as a photoacid-labile ester e.g. a tert-butyl ester and the like; etc.

m is 1 (to provide a fused five-membered ring), 2 (to provide a fused six-membered ring), 3 (to provide a fused seven-membered ring), or 4 (to provide a fused eight-membered ring);

n is an integer of from 0 (i.e. no R ring substituents), 1 (i.e. a single R ring substituent) to the maximum possible value permitted by the valences of the ring members, and preferably n is 0, 1, 2, 3, 4 or 5 , and more preferably n is 0, 1, 2 or 3;

p is the mole fraction of the fused oxygen ring units based on total units in the polymer; and r is the mole fraction of the fused carbon alicyclic ring units based on total units in the polymer, and p and r are each greater than zero.

Preferred polymers that may be synthesized by process of the invention also include those that comprise a structure of the following formula:

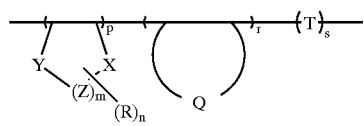

wherein T is a polymerized optionally substituted acrylate group and is preferably photoacid-labile e.g. a polymerized t-butylacrylate, t-butylmethacrylate, methyladamantylacrylate, or methyladamantylmethacrylate;

X, Y and Z are each independently carbon, oxygen or sulfur, with at least one of X, Y or Z being oxygen or sulfur, and preferably no more than two of X, Y and Z being oxygen or sulfur;

Q represents an optionally substituted carbon alicyclic ring fused to the polymer backbone (i.e. two Q ring members being adjacent carbons of the polymer backbone); the alicyclic ring suitably having from about 5 to about 18 carbon atoms and is suitably a single ring (e.g. cyclopentyl, cyclohexyl or cycloheptyl), or more preferably Q is polycyclic e.g. and contain 2, 3, 4 or more bridged, fused or otherwise linked rings, and preferred substituents of a substituted Q group include photoacid-labile moieties such as a photoacid-labile ester;

each R is the same or different non-hydrogen substituent such as cyano; optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably 1 to about 10 carbon atoms; optionally substituted alkylsulfonyl preferably having 1 to about 10 carbon atoms; optionally substituted carboxy preferably have 1 to about 10 carbon atoms (which includes groups such as —COOR' where R' is H or $C_{1-8}$alkyl, including esters that are substantially non-reactive with photoacid); a photoacid-labile group such as a photoacid-labile ester e.g. a tert-butyl ester and the like; etc.

m is 1 (to provide a fused five-membered ring), 2 (to provide a fused six-membered ring), 3 (to provide a fused seven-membered ring), or 4 (to provide a fused eight-membered ring);

n is an integer of from 0 (i.e. no R ring substituents), 1 (i.e. a single R ring substituent) to the maximum possible value permitted by the valences of the ring members, and preferably n is 0, 1, 2, 3, 4 or 5, and more preferably n is 0, 1, 2 or 3;

p, r and s are the mole fractions of the respective units and each of p, r and s each is greater than zero.

Preferred polymers that may be synthesized by process of the invention also include those that comprise a structure of the following Formula V:

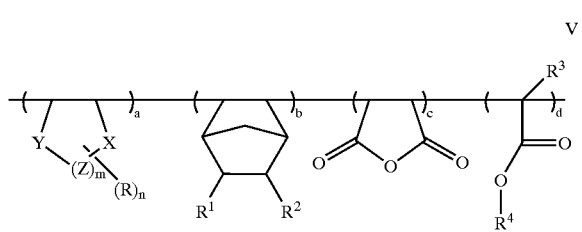

V wherein X, Y, and Z are each independently carbon, oxygen or sulfur, with at least one of X, Y and Z being oxygen or sulfur, and preferably no more than two of X, Y and Z being oxygen or sulfur;

each R is the same or different non-hydrogen substituent such as cyano; nitro; halogen; optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably having 1 to about 10 carbon atoms; optionally substituted alkylsulfonyl preferably having 1 to about 10 carbon atoms; optionally substituted alkylcarboxy preferably having 1 to about 10 carbon atoms (which includes groups such as —COOR' where R is H or $C_{1-8}$alkyl, including esters that are substantially non-reactive with photoacid); a photoacid-labile group such as a photoacid-labile ester e.g. tert-butyl ester and the like; etc.;

$R^1$ and $R^2$ are each the same or different non-hydrogen substituent such as cyano; nitro; halogen (F, Cl, Br or I); optionally substituted alkyl preferably having 1 to about 10 carbon atoms; optionally substituted alkanoyl preferably having 1 to about 10 carbon atoms; optionally substituted alkoxy preferably having 1 to about 10 carbon atoms; optionally substituted alkylthio preferably having 1 to about 10 carbon atoms; optionally substituted alkylsulfinyl preferably having 1 to about 10 carbon atoms; optionally substituted alkylsulfonyl preferably having 1 to about 10 carbon atoms; optionally substituted alkylcarboxy preferably having 1 to about 10 carbon atoms (which includes groups such as —COOR' where R is H or $C_{1-8}$alkyl, including esters that are substantially non-reactive with photoacid); a photoacid-labile group such as a photoacid-labile ester e.g. tert-butyl ester and the like; an anhydride such as itaconic anhydride; a lacone; etc.;

or $R^1$ and $R^2$ may be taken together to form one or more rings fused to the depicted norbornyl ring;

m is 1 (to provide a fused five-membered ring), 2 (to provide a fused six-membered ring), 3 (to provide a fused seven-membered ring), or 4 (to provide a fused eight-membered ring);

n is an integer of from 0 (i.e. no R ring substituents), 1 (i.e. a single R substituent) to the maximum possible value permitted by the valences of the ring members, and preferably n is 0, 1, 2, 3, 4, or 5, and more preferably n is 0, 1, 2 or 3;

$R^3$ is hydrogen or alkyl, particularly $C_{1-6}$alkyl such as methyl;

$R^4$ is a group that renders the depicted ester photoacid-labile, such as a tertiary alicyclic group as discussed above, or a branched non-cyclic optionally substituted alkyl group, with the ester carboxyl group being directly bonded to a quaternary (i.e. no hydrogen substituents) carbon atom; and a, b, c, and d are each greater than zero and are mole fractions of the respective polymer units.

Preferred polymers of the invention also include those of the following Formula VI:

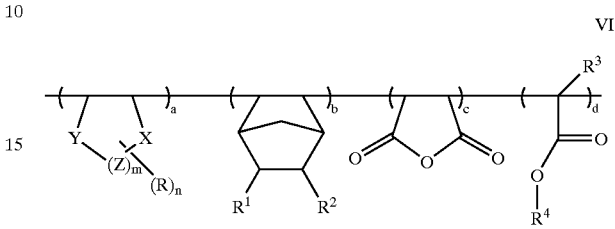

VI wherein X, Y, Z, R, $R^1$, $R^2$, m and n are each the same as defined in Formula V above;

$R^3$ is hydrogen or alkyl, particularly hydrogen or $C_{1-6}$ alkyl such as methyl;

$R^4$ is a group that renders the depicted ester photoacid-labile, such as a tertiary alicyclic group as discussed above, or a branched non-cyclic optionally substituted alkyl group, with the ester carboxyl group being directly bonded to a quaternary (i.e. no hydrogen substituents) carbon atom; and a, b, c, and d are each greater than zero and are mole fractions of the respective polymer units.

In each of above Formulae V and VI, preferably "a" (mole fraction of heteroalicyclic units) is from about 2 to 50 mole percent based on total polymer units; more preferably "a" is from about 2 to about 40 mole percent based on total polymer units; and still more preferably "a" is from about 2 to about 30 mole percent based on total polymer units.

In each of above Formulae V and VI, preferably "b" (mole fraction of norbornene units) is from about 2 to 25 mole percent based on total polymer units; more preferably "b" is from about 2 to about 20 mole percent based on total polymer units; and still more preferably "b" is from about 2 to about 15 or 20 mole percent based on total polymer units.

In each of above Formulae V and VI, preferably "c" (mole fraction of anhydride units) is from about 0 (i.e. no anhydride units) to 50 mole percent based on total polymer units; more preferably "c" is from about 2 to about 40 mole percent based on total polymer units.

In each of above Formulae V and VI, preferably "d" (mole fraction of photoacid-labile ester unit) is from about 2 to 70 mole percent based on total polymer units; more preferably "d" is from about 5 or 10 to about 70 mole percent based on total polymer units; still more preferably "d" is from about 5 or 10 to about 50 mole percent based on total polymer units.

As discussed above, polymers of the invention are preferably employed in photoresists imaged at short wavelengths, particularly sub-200 nm such as 193 nm and 157 nm. Polymers also can be employed in photoresists imaged at higher wavelengths such as 248 nm. For such higher wavelength applications, the polymer may suitably contain aromatic units, e.g. polymerized styrene or hydrostyrene units.

Specifically preferred polymers of the invention include those of the following Formula VII:

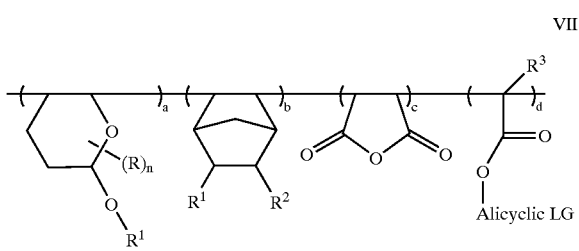

VII

In Formula VII above, "Alicyclic LG" is the same as defined for alicyclic substituent $R^4$ in Formulae V and VI above and is preferably methyladamantyl, 8-ethyl-8-tricyclodecanyl, ethylfencyl and the like; $R^1$ is $C_{1-8}$alkyl, preferably $C_{1-4}$ alkyl, o9r a moiety that forms a photoacid-labile group; $R^2$ is suitably hydrogen or $C_{1-8}$ alkyl, such as methyl, ethyl, propyl and the like; $R^{1'}$ and $R^{2'}$ are the same as defined for $R^1$ and $R^2$ respectively in Formula IA above; and a, b, c and d are mole percents of the specified units in the polymer based on total polymer units. Preferably a (mole percent of oxygen alicyclic units) is from 1 to about 5, 10, 20, 30, 40, 50 or 60 mole percent; b (mole percent of optionally substituted norbornene units) is from 1 to about 5, 10, 20, 30, 40, 50 or 60 mole percent; c (mole percent of maleic anhydride units) is from 1 to about 5, 10, 20, 30, 40, or 50 mole percent. Units d (acrylate photoacid-labile units) may be not be present (i.e. d is zero) where the heteroali-cyclic or norbornene units contain a photoacid-labile units, or d may be suitably present at from about 2 to 10, 20, 30, 40 or 50 mole percent based on total polymer units.

As discussed, various polymer moieties may be optionally substituted, including groups of the above formulae. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl and the like; etc.

Preferred alkanoyl groups, including as specified in the above formulae, will have one or more keto groups, such as groups of the formula —C(═O)R" where R" is hydrogen or $C_{1-8}$ alkyl. Suitable lactone groups, including as specified in the above formulae, include alpha-butyrolactone groups and the like.

In the synthesis of the invention, if conducted as a free radical addition, preferably the reaction is conducted under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed) as generally discussed above. Suitable reaction solvents include e.g. tetrahydrofuran, dioxane, ethyl lactate, DMF and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed. A chain transfer agent or other agent to control radical flux or concentration also may be used in the reaction.

Other monomers that can be reacted to provide a polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Maleic anhydride is a preferred reagent to provide fused anhydride polymer units. Itaconic anhydride also is a preferred reagent to provide anhydride polymer units, preferably where the itaconic anhydride has purified such as by extraction with chloroform prior to polymerization. Vinyl lactones are also preferred reagents, such as alpha-butyrolactone. Other suitable and preferred reactive monomers and other reagents have been identified above.

Some suitable vinyl (endocyclic double bond) heteroali-cyclic monomers that can be polymerized to provide polymers of the invention include the following:

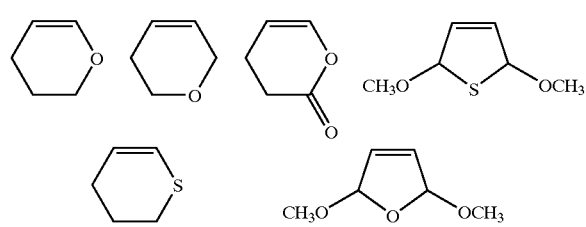

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less, even more preferably a molecular weight distribution of 1.5 or less or even 1.2 or 1 or less. The synthetic methods of the invention can provide such low (narrow) molecular weight distributions. Molecular weights (either Mw or Mn) of the polymers of the invention are suitably determined by gel permeation chromatography.

Polymers of the invention used in a chemically-amplified positive photoresist composition should contain a sufficient amount of photogenerated acid labile ester groups to enable formation of resist relief images as desired. For instance, suitable amount of such acid labile ester groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

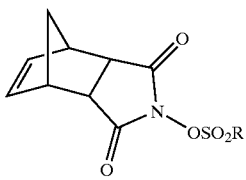

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

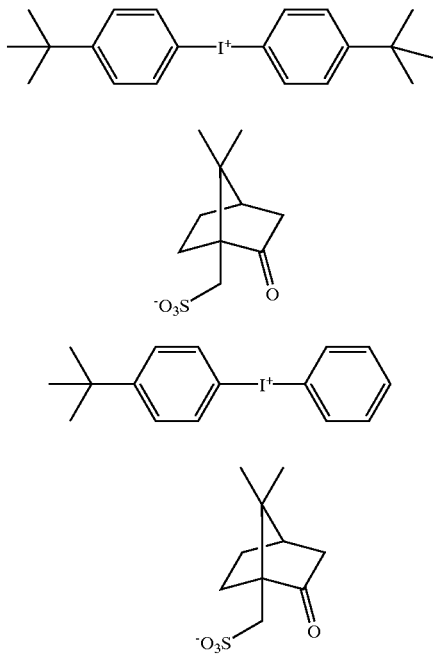

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

Negative-acting photoresists of the invention typically will contain a crosslinking component, preferably as a separate resist component. Amine-based crosslinkers often will be preferred such as a melamine, e.g. the Cymel melamine resins.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Resists of the invention also may be applied over an anti-reflective layer, particularly an organic antireflective layer.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength. 157 nm also is a preferred exposure wavelength. For 157 nm exposure, a resist may suitably contain a polymer of the invention that contains fluorine substitution, such as may be provided by polymerization of a fluoro-olefin, e.g. tetrafluoroethylene. However, the resist compositions of the invention also may be suitably imaged at higher wavelengths. For example, a resin of the invention can be formulated with an appropriate PAG and sensitizer if needed and imaged at higher wavelengths e.g. 248 nm or 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Polymer Synthesis

To a preheated (85° C.) 2 L jacketed reactor with a 4 neck top containing an overhead stirrer, a reflux condenser, nitrogen line, and 2 feed lines, maleic anhydride (49.26 g, 0.502 mol), norbornene (15.77 g, 0.167 mol) and 3,4-dihydro-pyran (28.17 g, 0.335 mol) were added as 50% (wt/wt) solutions in dioxane. An initial charge of 7.71 g (2 mol % of total monomers) of the initiator, dimethyl-2,2'-azodiisobutyrate, was then added to this mixture. Immediately after this initial charge of initiator, 50% (wt/wt) solutions of the initiator (dimethyl-2,2'-azodiisobutyrate) and 2-methyladamantanyl methacrylate in dioxane were added to the reaction at controlled rates through separate feed lines over the course of the reaction. The initiator was added at such a rate to maintain a constant level of 2 mol % initiator relative to total monomer concentration. The solution of 2-methyladamantanyl methacrylate in dioxane was added using a linear gradient, from a high of 4.6 g/minute to a low of 0.5 g/minute, until 156.81 g (0.670 mol) was added. After the 2-methyladamantanyl methacrylate charge was complete (approximately 2 hours) both feeds were stopped, the reaction allowed to continue at 85° C. for 15 minutes and then cooled rapidly to room temperature. The reaction mixture is then diluted to 33% (wt/wt) with dioxane, precipitated into 10 times its volume of isopropyl alcohol, filtered, washed with isopropyl alcohol, and dried over night at 40° C. in the vacuum oven. Yield=80%.

EXAMPLE 2

Photoresist Preparation and Lithographic Processing

A photoresist of the invention is prepared by mixing the following components with amount expressed as weight percents based on total weight of the resist composition:

| Resist components | Amount (wt. % based on total solids) |
|---|---|
| Resin binder | 28.2 |
| Photoacid generator | 0.52 |
| Basic additive | 0.03 |
| Surfactant | 0.03 |

The resin binder is the polymer of Example 2 above. The photoacid generator is triphenylsulfonium triflate. The basic additive is triisopropanol amine. The surfactant is Silwet (Dow Chemical). Those resist components were formulated at 16 wt. % solids in a solvent of 2-heptatone.

The formulated resist composition is spin coated onto HMDS vapor primed 4 inch silicon wafers and softbaked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with alkaline aqueous developer (0.26N aqueous tetramethylammonium hydroxide solution to develop the imaged resist layer and provide a relief image.

EXAMPLE 3

Comparative Polymerization

Four monomers were polymerized by two distinct methods: 1) a continuous addition of the invention ("Controlled Addition Method"); and 2) a batch addition where all monomers are added simultaneously to the reaction vessel at the commencement of the reaction ("Batch Synthesis Method). The four monomers were methyladamantanyl methacrylate; maleic anhydride; norbornene (15.77 g, 0.167 mol); and 3,4-dihydro-pyran (28.17 g, 0.335 mol), and The Batch Synthesis Method was conducted as follows. A mixture of 2-methyladamantanyl methacrylate (156.81 g, 0.670 mol), maleic anhydride (49.26 g, 0.502 mol), norbornene (15.77 g, 0.167 mol), 3,4-dihydro-pyran (28.17 g, 0.335 mol), and dimethyl-2,2'-azodiisobutyrate (7.71 g, 2 mol % of total monomers) in 250 g of dioxane was placed in a round-bottomed flask fitted with a reflux condenser and nitrogen purge. The flask was then placed in a pre-heated 85° C. oil bath. This reaction mixture was stirred at this temperature for 24 hours, under nitrogen. After cooling the reaction mixture to room temperature, the solution was diluted with 250 g of dioxane. The polymer was isolated by precipitation into 5.0 L of isopropyl alcohol, then filtered off and washed with an additional 1.0 L of isopropyl alcohol. Finally, the polymer was dried in a vacuum oven at 40° C. for overnight, yield=76.3%.

The Controlled Addition Method was conducted as described in Example 1.

Results

The Batch Synthesis Method resulted in maleic anhydride reacting at a much faster rate than the 3,4,-dihydro-2-H-pyran as determined by infrared IR spectroscopy during the polymerization, the maleic anhydride reacting at a much faster rate than the 3,4-dihydro-2-H-pyran. It is believed that this difference in monomer consumption rate in the Batch Synthesis Method is primarily due to the greater reactivity of the methacrylate with the maleic anhydride compared to the vinyl ether.

In contrast, in the Controlled Addition Method reaction, the rate of addition of the 2-methyladamantanyl methacrylate and initiator into the polymerization solution containing the maleic anhydride, norbornene and 3,4-dihydro-2-H-pyran were controlled, and as a result the conversion rates of the maleic anhydride and vinyl ether are much closer, as determined by infrared spectroscopy.

This improvement in compositional uniformity across molecular weight distribution resulted in improved lithographic performance compared to similar polymers prepared by Batch Synthesis Method.

EXAMPLE 4

Further Polymer Synthesis of the Invention

A first solution (referred to below as the "First Solution") was prepared that contained 50.70 grams of dihydropyran, 28.38 grams norbornene and 92.97 grams of tetrahydrofuran admixed in a beaker and stirred to dissolve solids.

A second solution (referred to below as the "Second Solution") was prepared that was a 50 weight percent of the free radical initiator v601 in tetrahydrofuran.

A third solution (referred to below as the "Third Solution") was prepared that contained 93.09 grams of maleic anhydride, 296.37 grams of methyladamantyl acrylate and 389 grams of tetrahydrofuran.

Each of the First Solution, Second Solution and Third Solution were charged into separate addition vessels in connection to a reaction vessel. Each of those addition vessels was outfitted with an automated addition pump for transfer of the solution to the reaction vessel.

The reaction vessel was fitted with a heat source, stir paddle and water condenser and blanketed under nitrogen flow.

Addition of the First Solution to the reaction vessel was then commenced. At the point the solution in the reaction vessel reached 70° C., addition of the Second Solution was commenced.

After 13.88 grams of the Second Solution was added, addition of the Third solution was commenced. The Second and Third Solutions were added at the following rates for the next 210 minutes: Second Solution: 0.09 grams of solution per minute; Third Solution: 3.57 grams of solution per minute. The reaction mixture was maintained at 80° C. during the additions.

After 210 minutes of addition, the additions were terminated and the reaction mixture stirred for a further 30 minutes. The reaction mixture was then cooled to room temperature. The resulting polymer was isolated by precipitation through addition of the reaction mixture to a 10:1 v/v isopropanol:tetrahydrofuran solution. The precipitated polymer was then redissolved into tetrahydrofuran, and then precipitated again by addition to a 10:1 v/v isopropanol:tetrahydrofuran solution. The precipitated polymer was isolated, air dried and then vacuum dried at 40° C.

EXAMPLES 5–8

Syntheses of Monomers Useful in Preparation of Polymers of the Invention

EXAMPLE 5

EtTCD Methacrylate Monomer Synthesis 8-ethyl-8-tricyclodecanylmethacrylate (EtTCD methacrylate) was prepared as following using the reagents and amounts thereof as specified in the following table.

| Material | Amt (g) | Amt (ml) | Moles | Source |
| --- | --- | --- | --- | --- |
| TCD | 150.22 | | 1.00 | TCI |
| Ethylmagnesiumchloride (25%) | 390.85 | ~379.5 | ~1.10 | ACROS |
| Methacryloyl chloride | 120.22 | ~112.4 | ~1.15 | Aldrich |
| Tetrahydrofuran | 480 | 540 | | Aldrich |

All reaction glassware was dried in the oven overnight at 100° C. The glassware was set up and cooled under a stream of nitrogen. The reaction was carried out under a blanket of nitrogen.

To a 2 L 3N-RB flask fitted with a gas inlet, thermometer, overhead stirrer and a rubber septum was added 400 g of ethylmagnesium chloride, 25 wt % solution in tetrahydrofuran (clear, amber solution) via a double tipped needle using nitrogen pressure. The mixture was cooled to −25 to −30° C. using a dry ice/isopropanol bath. While the ethylmagnesium chloride solution was cooling the 153.6 g of tricyclodecane (TCD) was dissolved in 480 g of tetrahydrofuran. To a 1 L 3N-RB flask equipped with a gas inlet, glass stopper and a rubber septum was added the 153.6 g of TCD. The anhydrous, inhibitor free tetrahydrofuran was transferred to the 1 L flask via a double tipped needle using nitrogen pressure. When the ethylmagnesium chloride was at −25 to −30° C., the TCD/THF solution was transferred over a 2 hr period to the 2 L 3N-RB flask containing the ethylmagnesium chloride via a double tipped needle using nitrogen pressure. The cooling bath was removed and the reaction mixture was stirred for 2 hr. After stirring for 2 hr the mixture was again cooled to −25 to −30° C. using a dry ice/isopropanol bath. The methacryloyl chloride (120.22 g) was then added dropwise over a 1 hour period using a 125 ml pressure equalizing dropping funnel. The reaction was allowed to come to room temperature with overnight stirring. A white precipitate developed from the clear amber colored reaction solution. Water (DI) was added until all of the salts had dissolved (~500 ml) and two distinct layer were seen. The layers were separated and the organic (upper) layer was washed with 2×400 ml DI water then dried over magnesium sulfate. The THF was removed leaving 258 g of an orange oil. The orange oil was dissolved in 400 g of hexane then passed through a 400 g silica gel plug which had been pre-conditioned with hexane. The silica was washed with hexane until all of the product was removed (spot filtrate on a TLC plate and illuminate under short UV). The hexane was removed leaving 202.8 g of an clear, colorless oil. Theoretical yield: 248.4 g; yield: 81.6%

EXAMPLE 6

Synthesis of Norbornene Valerolactone

A solution of valerolactone (50.1 g) in 150 mL of anhydrous THF was placed in a three-neck-bottomed flask at −78° C. (Dry Ice/acetone). To it, solution of LDA (250 mL, 2M) in 250 mL anhydrous THF was added dropwise. The reaction mixture was stirred at this temperature for 4 hours. Then, the thermal cracking of paraformaldehyde (36.94 g, excess) was bubbled into the reaction mixture. After the paraformaldehyde was all cracked, the reaction mixture was stirred at the same bath and stirred for overnight. Then, the solvent was removed by rotary pump and the residue was added 500 mL $CH_2Cl_2$ and washed with $NaHCO_3$ (aq, sat.) and water several times (3×500 mL). The combination organic solvent was dried over $MgSO_4$ and the solvent was removed by rotary pump. The desired product was distilled under vacuum (135–140° C./8 mmHg)

The methylene-valerolactone was dissolved in dichloromethane and freshly cracked cyclopentadiene was added. The reaction mixture was stirred at room temperature for 3 hours, then heated to 40° C., and held at 40° C. overnight. The reaction mixture was then slowly cooled to room temperature. The methylene chloride was removed under reduced pressure, leaving an oil. The crude oil was then distilled under reduced pressure to afford pure product.

EXAMPLE 7

Synthesis of 8-methyltricyclodecanyl methacrylate

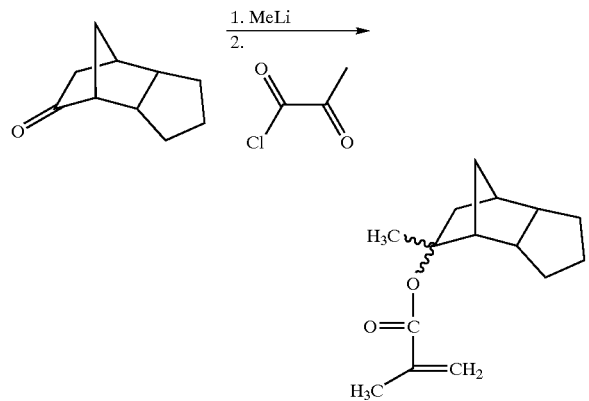

A solution of 125 ml of 1.4 M methyl lithium (in ethyl ether)in 100 ml of hexane was decanted into a three neck round-bottom flask at an ice-water bath. To it, a solution of 24.00 g of tricyclo[5.2.1.0]decan-8-one in hexane was added dropwise. After addition, the reaction mixture was stirred for 4 hours at 0° C. Then, a solution of 16 ml of methacroyl chloride in 100 ml of hexane was added dropwise at 0° C. After addition, the reaction mixture was stirred at the same bath for overnight (16 hours). After filtering the white salts, the organic layer was washed with water three times (3×300 ml). Then, the washed organic layer was dried over anhydrous MgSO$_4$. The organic solvent was removed by a rotary pump to give the crude title monomer (23.5 g). The monomer was purified by a flash column chromatography (purity >98%, silica gel with hexane). $^1$H NMR: 6.05 (1H), 5.50 (1H), 1.95 (3H), 1.65 (3H), 2.25–0.85 (14H).

EXAMPLE 8

Synthesis of Pinnanyl Methacrylate

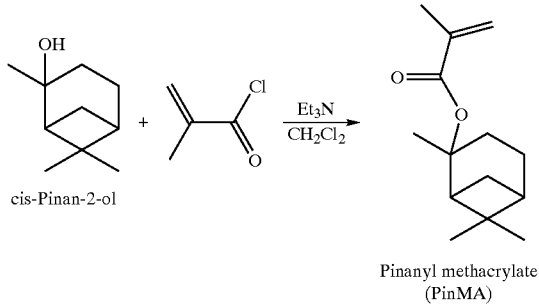

Materials Used:

| | Amount Charged | Moles | Source |
|---|---|---|---|
| cis-Pinan-2-ol | 15.43 g | 0.10 | Fluka |
| Et$_3$N | 12.14 g | 0.12 | Aldrich, distilled before use |
| Methacryloyl chloride | 13.07 g | 0.125 | Aldrich, distilled before use |
| CH$_2$Cl$_2$ | 230 mL | | Aldrich, dried and distilled |

Procedure:

All reaction glassware and needles were dried and flushed with dry N$_2$ before use and the reaction was carried out under nitrogen atmosphere.

1) Into a 500 mL 3-neck round-bottom-flask equipped with an addition funnel and a magnetic stirrer were added 15.43 g of cis-pinan-2-ol and 200 mL of dry CH$_2$Cl$_2$ (Stirred over CaH$_2$ overnight, then distilled and stored over activated molecular sieves). The resulting colorless solution was cooled with an ice-water bath.

2) Triethylamine (12.14 g) was added through the addition funnel to the cooled CH$_2$Cl$_2$ solution over 10 min. After added, the resulting solution was kept in a dry-ice/acetone bath (–67° C.).

3) A CH$_2$Cl$_2$ (30 mL) solution of methacryloyl chloride (13.07 g) was added dropwise over 20 min. The resulting orangish suspension was allowed to warm to room temperature and stirred for 2 h.

4) The chloride salts were filtered off. The filtrate was washed with saturated Na$_2$CO$_3$ solution (2×200 mL), then DI water (3×200 mL), and dried over anhydrous MgSO$_4$.

5) The slightly yellow CH$_2$Cl$_2$ solution was concentrated on a rotary evaporator (bath temperature kept below 35°) to yield a clear slightly yellow liquid product. Yield=79%. The product was judged pure by NMR.

The foregoing description of the invention is merely illustrative thereof, and it is understood that variations and modification can be made without departing from the spirit or scope of the invention as set forth in the following claims.

What is claimed is:

1. A method for preparing a photoresist composition, comprising:
    a) providing a polymer by a polymerization reaction that comprises adding over the substantial course of the polymerization reaction one or more incorporated polylmerization reagents to a reaction mixture,
    wherein multiple incorporated polymerization reagents are reacted, and the incorporated polymerization reagent with the second fastest reaction rate relative to the other incorporated polymerization reagents is added to the reaction mixture over the substantial course of the polymerization reaction; and
    b) admixing the polymer with a photoactive component.

2. A method of preparing a photoresist composition, comprising:
    a) providing a polymer that comprises units that comprise a polymerized maleic anhydride group, the polymer provided by a polymerization reaction that comprises adding maleic anhydride over the substantial course of the polymerization reaction to a reaction mixture; and
    b) admixing the polymer with a photoactive component.

3. A method of preparing a photoresist composition, comprising:
   a) providing a polymer that comprises units that comprise a polymerized acrylate group, the polymer provided by a polymerization reaction that comprises adding an acrylate compound over the substantial course of the polymerization reaction to a reaction mixture; and
   b) admixing the polymer with a photoactive component.

4. The method of claim 3 wherein the acrylate compound comprises a photoacid-labile ester.

5. A method of preparing a photoresist composition comprising:
   a) providing a polymer that comprises units that comprise a lactone moiety, the polymer provided by a polymerization reaction that comprises adding a compound comprising a lactone moiety over the substantial course of the polymerization reaction to a reaction mixture; and
   b) admixing the polymer with a photoactive component.

6. A method for preparing a photoresist composition, comprising:
   a) providing a polymer by a polymerization reaction that comprises adding over the substantial course of the polymerization reaction one or more incorporated polymerization reagents to a reaction mixture;
   b) admixing the polymer with a photoactive component; and
   c) applying on a substrate a coating layer of a photoresist composition comprising the polymer and photoactive component, exposing the photoresist layer to radiation having a wavelength of less than about 300 nm and developing the exposed the photoresist layer to yield a relief image.

7. The method of any one of claims 1, 2, 3, 5 or 6 wherein multiple incorporated polymerization reagents are reacted, and the incorporated polylmerization reagent with the fastest reaction rate relative to the other incorporated polymerization reagents is added to the reaction mixture over the substantial course of the polymerization reaction.

8. The method of any one of claims 2, 3, 5 or 6 wherein multiple incorporated polymerization reagents are reacted, and the incorporated polymerization reagent with the second fastest reaction rate relative to the other incorporated polymerization reagents is added to the reaction mixture over the substantial course of the polymerization reaction.

9. The method of any one of claims 1, 2, 3, 5 or 6 wherein multiple incorporated polymerization reagents are reacted, and the incorporated polymerization reagent with the slowest fastest reaction rate relative to the other incorporated polymerization reagents is present in the reaction mixture at the start of the polymerization reaction and is not added to the reaction mixture over the substantial course of the polymerization reaction.

10. The method of any one of claims 1, 2, 3, 5 or 6 wherein a reaction mixture that contains one or more polymerization reagents is initially provided at the start of the polymerization reaction, and
   one or more additional polymerization reagents are added to the reaction mixture over the substantial course of the polymerization reaction.

11. The method of claim 10 wherein the reaction mixtures comprises an optionally substituted carbon alicyclic compound or an optionally substituted heteroalicyclic compound at the start of the polymerization reaction.

12. The method of claim 10 wherein the reaction mixtures comprises an optionally substituted norbornene compound at the start of the polymerization reaction.

13. The method of any one of claims 1, 2, 3, 5 or 6 wherein each incorporated polymerization reagent is added to a reaction mixture over the substantial course of the polymerization reaction.

14. The method of any one of claims 1, 2, 3, 5 or 6 wherein the polymerization reaction is a free radical mediated reaction.

15. The method of any one of claims any one of claims 1, 2, 3, 5 or 6 wherein the polymerization reaction is an anionic, cationic or metal catalyzed reaction.

16. The method of any one of claims 1, 2, 3, 5 or 6 wherein one or more of the polymerization reagents is selected from the group consisting of a fluorinated olefin, a carbon alicyclic compound, or a heteroalicyclic compound.

17. The method of any one of claims 1, 2, 3, 5 or 6 wherein one or more of the polymerization reagents is 2-methyladamantanyl methacrylate, 2-methyladamantanyl acrylate, maleic anhydride, norbornene, 3,4-dihydropyran, or tetrafluoroethylene.

18. The method of any one of claims 1, 2, 3, 5 or 6 wherein each of th polymerization reagent is a non-aromatic compound.

19. The method of any one of claims 1, 2, 3, 5 or 6 wherein one or more of the polymerization reagents is an aromatic compound.

20. The method of any one or claims 1, 2, 3, 5 or 6 wherein one or more of the polymerization reagents comprises an optionally substituted phenyl or optionally substituted naphthyl moiety.

21. The method of any one of claims 1, 2, 3, 5 or 6 wherein one or more polymerization reagents are added over at least about 80 percent of the duration of the polymerization reaction.

22. The method of any one of claims 1, 2, 3, 5 or 6 wherein at least two polymerization reagents arc added over the substantial course of the polymerization reaction.

23. The method of any one of claims 1, 2, 3, 5 or 6 wherein a radical initiator compound is added over the substantial course of the polymerization reaction.

24. The method of claim 23, wherein the initiator is added at a rate to maintain a substantially constant concentration of initiator within the reaction mixture over the substantial course of the polymerization reaction.

25. The method of any one of claims 1, 2, 3, 5 or 6 wherein a reaction vessel is initially charged with one or more polymerization reagents, and one or more polymerization reagents having a faster reaction rate than the charged reagents are added to the reaction vessel over the substantial course of the polymerization reaction.

26. The method of any one of claims 1, 2, 3, 5 or 6 wherein the polymer comprises photoacid labite repeat units that contain a tertiary alicyclic group.

27. The method of any one of claims 1, 2, 3, 5 or 6 wherein the polymer comprises a polymerized fluorinated unsaturated monomer.

28. The method of any one of claims 1, 2, 3, 5 or 6 wherein the polymer comprises a fused heteroalicyclic group having an oxygen ring member or sulfur ring member.

29. The method of any one of claims 1, 2, 3, 5 or 6 wherein the polymer comprises a structure of the following formula:

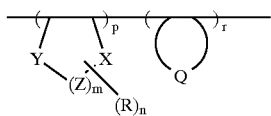

wherein X, Y and z are each independently carbon, oxygen or sulfur, with at least one of X, Y or Z being oxygen or sulfur, and preferably no more than two of X, Y and Z being oxygen or sulfur;

Q represents an optionally substituted carbon alicyclic group fused to the polymer backbone;

p and r are the mole fractions of the respective units and each of p and r is greater than zero.

30. The method of any one of claims 1, 2, 3, 5 or 6 wherein the composition comprising the polymer and photoactive component is a chemically-amplified positive-acting resist.

31. The method of any one of claims 1, 2, 3, 5 or 6 wherein the composition comprising the polymer and photoactive component is a negative-acting resist.

32. The method of any one of clams 1, 2, 3 or 5 further comprising applying on a substrate a coating layer of the photoresist composition comprising the polymer and photoactive component; exposing the photoresist coating layer to patterned activating radiation; and developing the exposed photoresist coating layer to provide a resist relief image.

33. The method of claim 32 wherein the photoresist layer is exposed with radiation having a wavelength of less than about 300 nm.

34. The method of claim 32 wherein the photoresist layer is exposed with radiation having a wavelength of less than about 200 nm.

35. The method of claim 32 wherein the photoresist layer is exposed with radiation having a wavelength of about 193 nm.

36. The method of claim 32 wherein the substrate is a microelectronic wafer.

37. The method of claim 32 wherein the substrate is a microelectronic wafer.

38. The method of claim 6 wherein the photoresist layer is exposed with radiation having a wavelength of less than about 200 nm.

39. The method of claim 6 wherein the photoresist layer is exposed with radiation having a wavelength of about 193 nm.

40. A method forming a photoresist relief image, comprising:

(a) applying on a substrate a coating layer of a photoresist comprising a photoactive component and a polymer obtainable by adding over the substantial course of a polymerization reaction one or more incorporated polymerization reagents to a reaction mixture; and (b) exposing the photoresist layer to radiation having a wavelength of less than about 300 nm and developing the exposed the photoresist layer to yield a relief image.

41. The method of claim 40 wherein the photoresist layer is exposed with radiation having a wavelength of less than about 200 nm.

42. The method of claim 40 wherein the photoresist layer is exposed with radiation having a wavelength of about 193 nm.

43. The method of claim 40 wherein multiple incorporated polymerization reagents are reacted, and the incorporated polymerization reagent with the fastest reaction rate relative to the other incorporated polymerization reagents is added to the reaction mixture over the substantial course of the polymerization reaction.

44. The method of claim 40 wherein multiple incorporated polymerization reagents are reacted, and the incorporated polymerization reagent with the second fastest reaction rate relative to the other incorporated polymerization reagents is added to the reaction mixture over the substantial course of the polymerization reaction.

45. The method of claim 40 wherein multiple incorporated polymerization reagents are reacted, and the incorporated polymerization reagent with the slowest fastest reaction rate relative to the other incorporated polymerization reagents is present in the reaction mixture at the start of the polymerization reaction and is not added to the reaction mixture over the substantial course of the polymerization reaction.

46. The method of claim 40 wherein the polymer is obtained by adding over the substantial course of a polymerization reaction one or more incorporated polymerization reagents to a reaction mixture.

47. The method of claim 40 wherein the polymer is obtained by adding over the substantial course of a polymerization reaction one or more incorporated polymerization reagents to a reaction mixture.

48. The method of claim 40 wherein maleic anhydride is added to the reaction mixture over the substantial course of the polymerization reaction.

49. The method of claim 40 wherein an acrylate compound is added to the reaction mixture over the substantial course of the polymerization reaction.

50. The method of claim 49 wherein the acrylate compound comprises a photoacid-labile ester.

\* \* \* \* \*